(12) United States Patent
King

(10) Patent No.: US 7,859,295 B2
(45) Date of Patent: Dec. 28, 2010

(54) TRANSMITTER APPARATUS, SYSTEMS, AND METHODS

(75) Inventor: Gregory King, Hastings, MN (US)

(73) Assignee: Micron Technology, Inc., Boise, ID (US)

( * ) Notice: Subject to any disclaimer, the term of this patent is extended or adjusted under 35 U.S.C. 154(b) by 223 days.

(21) Appl. No.: 12/141,794

(22) Filed: Jun. 18, 2008

(65) Prior Publication Data

US 2009/0318101 A1 Dec. 24, 2009

(51) Int. Cl.
*H03K 19/003* (2006.01)
*H03K 17/16* (2006.01)

(52) U.S. Cl. .............................. 326/26; 326/27; 326/33; 326/88

(58) Field of Classification Search ....................... None
See application file for complete search history.

(56) References Cited

U.S. PATENT DOCUMENTS

| 7,233,201 | B2 | 6/2007 | King et al. |
| 7,564,293 | B2 * | 7/2009 | Watanabe ................... 327/407 |
| 2007/0139350 | A1 * | 6/2007 | Kawaguchi et al. ......... 345/100 |

* cited by examiner

*Primary Examiner*—Anh Q Tran
(74) *Attorney, Agent, or Firm*—Schwegman, Lundberg & Woessner, P.A.

(57) ABSTRACT

Apparatus, systems, and methods are disclosed that operate to drive an output with a data signal and to boost a potential of the output in response to a boost signal. Additional apparatus, systems, and methods are disclosed.

25 Claims, 10 Drawing Sheets

TRANSMITTER APPARATUS, SYSTEMS, AND METHODS

BACKGROUND

Internal signals in an integrated circuit are often generated and transmitted as differential signals to reduce the effects of noise. Differential signals are sent over two lines such that a positive change in voltage in a first line is mirrored by a negative change in voltage in a second line. The state of an internal signal is determined from a voltage difference between the first and second lines. Noise picked up by the first and second lines is substantially the same and does not significantly interfere with the determination of the state of the internal signal.

The generation and transmission of differential signals in an integrated circuit requires more circuitry than would be needed to support single-ended signals. A single-ended signal is a signal sent over a single line. When a differential internal signal is to be transmitted to another integrated circuit it is often desirable to translate the differential internal signal into a single-ended signal before transmission outside the integrated circuit. This is done because the number of external pins dedicated to the integrated circuit and the number of lines available in a bus for transmitting signals from the integrated circuit can be limited.

DETAILED DESCRIPTION

Systems including transmitter circuits that drive output pins having large capacitive loads typically consume a substantial amount of power to do so. The inventor has discovered that the challenge noted above, as well as others, can be addressed by driving an output pin of a transmitter circuit with a data signal and boosting a potential of the output pin with a complementary signal. The output pin may be boosted during each transition of the data signal. A transmitter circuit operated in this way may drive large capacitive loads with low power and reduce the effects of supply and ground noise as well as series resistance in a chip-to-chip interconnect.

In this description, a transistor is described as being switched on when it is rendered conductive to allow current to flow between two terminals of the transistor. A transistor is described as being switched off when it is not conductive and there is no substantial current flow between two terminals of the transistor. Transistors described herein may be metal oxide semiconductor (MOS) transistors according to various embodiments. Both P-channel transistors and N-channel transistors may be MOS transistors.

In this description, a digital signal is a voltage waveform that transitions between a low voltage and a high voltage. The digital signal transitions from the low voltage to the high voltage through a rising edge, and the digital signal transitions from the high voltage to the low voltage through a falling edge. The edge rises or falls at a rate called the edge rate that may be slow or fast. A fast edge rises or falls over a short period of time and has a higher slope. A slower edge rises or falls over a longer period of time and has a lower slope.

Figure 1:
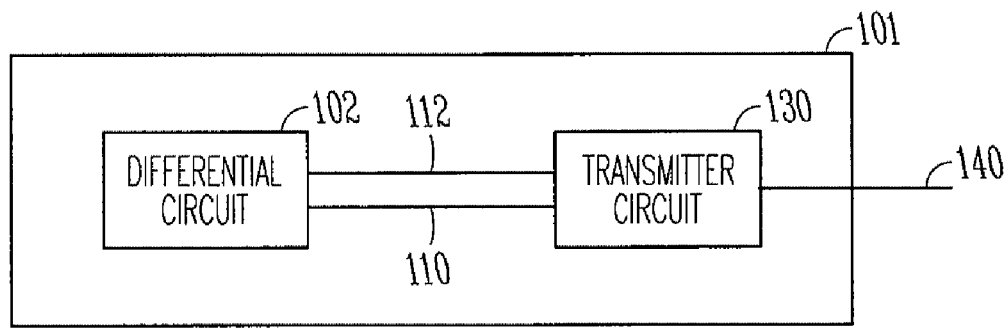
FIG. 1 is a block diagram of a system according to various embodiments of the invention.

FIG. 1 is a block diagram of a system 101 according to various embodiments of the invention. The system 101 includes a differential circuit 102 that generates a differential signal on a pair of lines 110 and 112, and the lines 110 and 112 are coupled to a transmitter circuit 130. The transmitter circuit 130 generates a single-ended output signal on a line 140 from the differential signal on the lines 110 and 112. The single-ended output signal on a line 140 may be coupled to other electronic systems.

Figure 2:
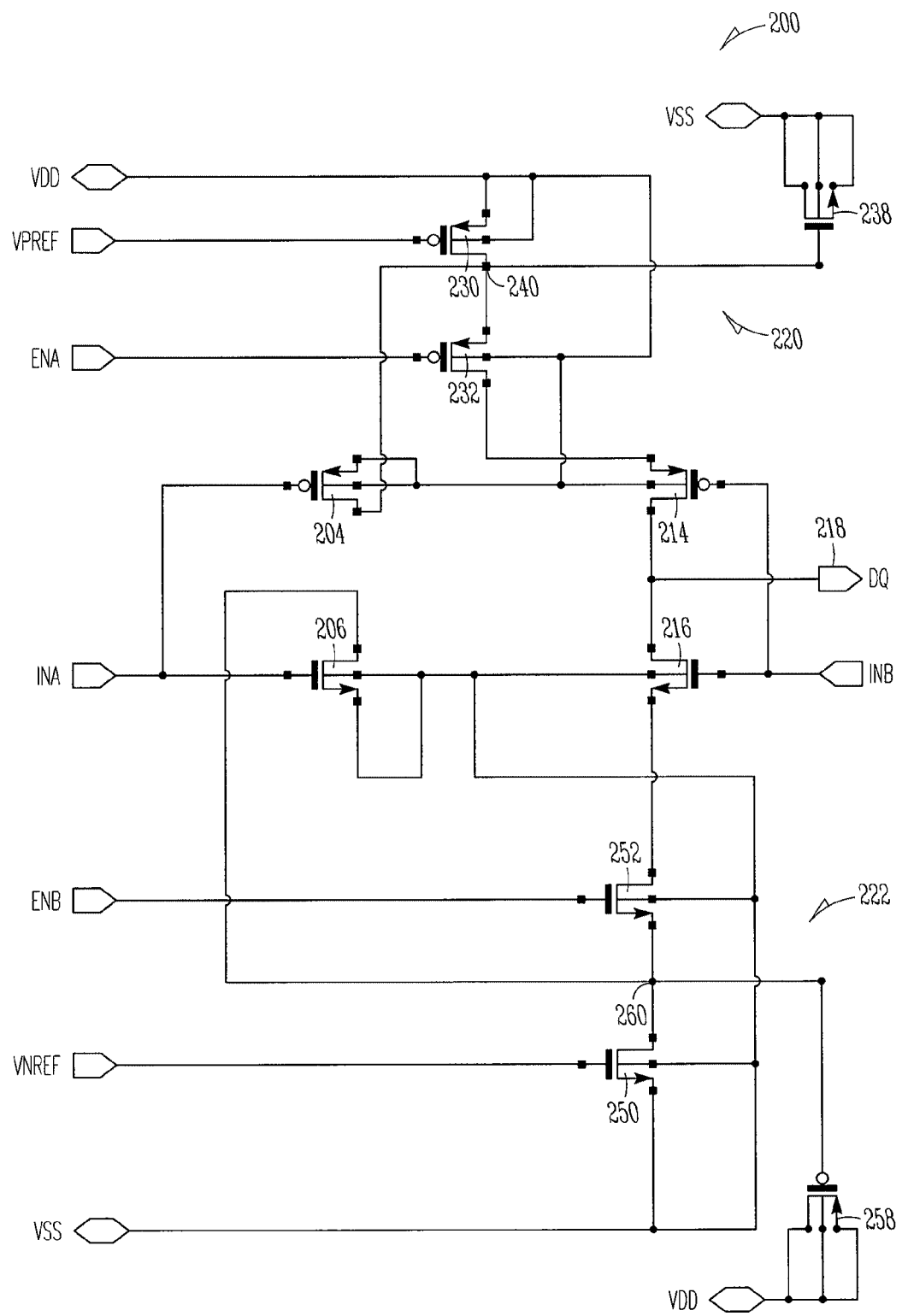
FIG. 2 is an electrical schematic diagram of a transmitter circuit according to various embodiments of the invention.

FIG. 2 is an electrical schematic diagram of a transmitter circuit 200 according to various embodiments of the invention. The transmitter circuit 200 is an example of the transmitter circuit 130 shown in FIG. 1.

A gate of a first P-channel transistor 204 and a gate of a first N-channel transistor 206 in the transmitter circuit 200 are coupled to receive a boost signal INA. A gate of a second P-channel transistor 214 and a gate of a second N-channel transistor 216 in the transmitter circuit 200 are coupled to receive a data signal INB. A drain of the second N-channel transistor 216 is coupled to a drain of the second P-channel transistor 214 and an output terminal 218 on which is transmitted a data signal DQ driven by the data signal INB. The second P-channel transistor 214 and the second N-channel transistor 216 operate as a buffer circuit, and more particularly an inverter, to generate the data signal DQ from the data signal INB.

Figure 3:
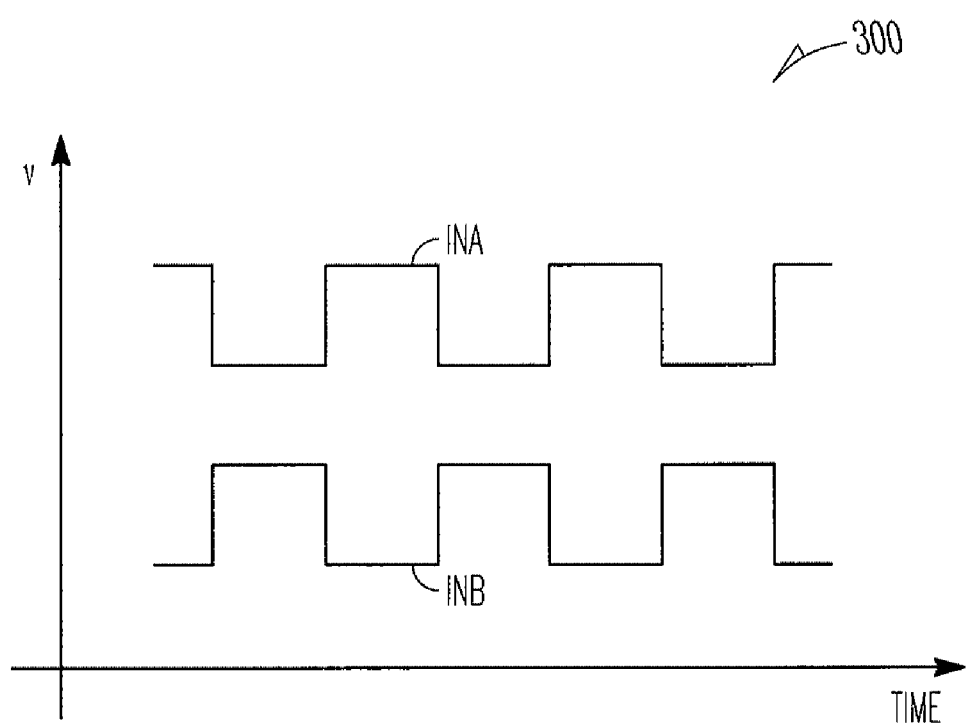
FIG. 3 is a timing chart of a boost signal and a data signal according to various embodiments of the invention.

FIG. 3 is a timing chart 300 of a boost signal INA and a data signal INB according to various embodiments of the invention. The boost signal INA and the data signal INB are first and second parts of an information signal received from a circuit (not shown) other than the transmitter circuit 200. The boost signal INA and the data signal INB are complementary digital signals that transition between a low voltage and a high voltage. The boost signal INA is derived from the data signal INB, and the boost signal INA and the data signal INB are a differential signal. The boost signal INA is high when the data signal INB is low, and the boost signal INA is low when the data signal INB is high. The operation of the transmitter circuit 200 will be described below with reference to the boost signal INA and the data signal INB shown in FIG. 3.

A potential of the output terminal 218 is raised by a pull-up network 220 and lowered by a pull-down network 222. The pull-up network 220 includes a first mirror transistor 230 and a first enable transistor 232. Both the first mirror transistor 230 and the first enable transistor 232 are P-channel transistors. The first mirror transistor 230 is part of a programmable current mirror circuit, the remainder of which is not shown. A programmable current mirror circuit is structured to provide a substantially constant current from a source, and the amount of current provided is programmable and may be changed while a circuit including the programmable current mirror circuit is operating. The pull-up network 220 is coupled to a voltage source VDD that is coupled to a source and a body terminal of the first mirror transistor 230 and to a body terminal of the first enable transistor 232. A source and a body terminal of the first P-channel transistor 204 and a body terminal of the second P-channel transistor 214 are also coupled to VDD. A drain of the first mirror transistor 230 is coupled to a source of the first enable transistor 232, and a drain of the first enable transistor 232 is coupled to a source of the second P-channel transistor 214.

A gate of the first mirror transistor 230 is coupled to receive a reference signal VPREF to switch on the first mirror transistor 230 to provide a substantially constant current from VDD. A gate of the first enable transistor 232 is coupled to receive a first enable signal ENA to switch on the first enable transistor 232 unless the transmitter circuit 200 is to be tri-stated. A transmitter circuit is in a tri-state condition when it presents a high-impedance, floating output at an output terminal. For example, the transmitter circuit 200 is tri-stated when it presents a high-impedance, floating output at the output terminal 218.

The pull-up network 220 also includes a first capacitor 238 in the form of an N-channel transistor. The first capacitor 238 has a first terminal that is a gate of the transistor coupled to the drain of the first mirror transistor 230 and the source of the first enable transistor 232 at a current summing node 240. A source, a drain, and a body terminal of the first capacitor 238 are coupled together as a second terminal of the first capacitor 238 to a low voltage reference VSS. VSS may be a ground voltage reference according to various embodiments of the invention. The first capacitor 238 stores charge that is used to raise a potential of the output terminal 218 as will be described below.

The pull-down network 222 includes a second mirror transistor 250 and a second enable transistor 252. The second mirror transistor 250 is part of a programmable current mirror circuit, the remainder of which is not shown. The second mirror transistor 250 and the second enable transistor 252 are both N-channel transistors, and a source of the second enable transistor 252 is coupled to a drain of the second mirror transistor 250. A source and a body terminal of the second mirror transistor 250 as well as a body terminal of the second enable transistor 252 are coupled to VSS. A source and a body terminal of the first N-channel transistor 206 and a body terminal of the second N-channel transistor 216 are also coupled to VSS. A drain of the second enable transistor 252 is coupled to a source of the second N-channel transistor 216.

The pull-down network 222 also includes a second capacitor 258 in the form of a P-channel transistor. The second capacitor 258 has a first terminal that is a gate of the transistor coupled to the drain of the second mirror transistor 250 and the source of the second enable transistor 252 at a current summing node 260. A source, a drain, and a body terminal of the second capacitor 258 are coupled together as a second terminal of the second capacitor 258 to VDD. The second capacitor 258 receives charge from the output terminal 218 to lower the potential of the output terminal 218, as will be described below.

A gate of the second mirror transistor 250 is coupled to receive a reference signal VNREF to switch on the second mirror transistor 250. A gate of the second enable transistor 252 is coupled to receive a second enable signal ENB. The first and second enable transistors 232 and 252 may be switched off by the first and second enable signals ENA and ENB to tri-state the transmitter circuit 200 if necessary.

The transmitter circuit 200 operates in the following manner. As shown in FIG. 3, the boost signal INA and the data signal INB are complementary such that the first N-channel transistor 206 is switched on when the second N-channel transistor 216 is switched off, and vice versa. Similarly, the first P-channel transistor 204 is switched on when the second P-channel transistor 214 is switched off, and vice versa. The boost signal INA governs the charging of the first capacitor 238 and the discharging of the second capacitor 258 when those capacitors are not being used to charge or discharge the output terminal 218. The data signal INB is driven on to the output terminal 218 by the second P-channel transistor 214 and the second N-channel transistor 216.

When the output terminal 218 is at a low potential and the data signal INB transitions to a low voltage, the second N-channel transistor 216 switches off and the second P-channel transistor 214 switches on to couple the output terminal 218 to charge from the first mirror transistor 230 and the first capacitor 238 through the first summing node 240 and the first enable transistor 232. Charge stored in the first capacitor 238 raises the potential of the output terminal 218 to a high voltage, and the high voltage is maintained at the output terminal 218 by a substantially constant current from the first mirror transistor 230 through the first enable transistor 232 after the first capacitor 238 is finished providing charge. The output terminal 218 is now at a high potential having received charge from the first capacitor 238.

At approximately the same time that the data signal INB transitions to a low voltage, the boost signal INA transitions to a high voltage to switch off the first P-channel transistor 204 and switch on the first N-channel transistor 206 to couple the gate of the transistor of the second capacitor 258 to VSS through the second summing node 260 and the first N-channel transistor 206. Substantially all of the charge stored in the second capacitor 258 is thereby removed to VSS.

The data signal INB then transitions to a high voltage on a subsequent edge that switches off the second P-channel transistor 214 and switches on the second N-channel transistor 216 to couple the output terminal 218 through the second N-channel transistor 216, the second enable transistor 252, the second summing node 260, and the second mirror transistor 250 to VSS to reduce the potential of the output terminal 218. In addition, following the low to high transition of the data signal INB, the gate of the transistor of the second capacitor 258 is coupled through the second summing node 260, the second enable transistor 252, and the second N-channel transistor 216 to the output terminal 218 to boost charge transfer from the output terminal 218 and bring the output terminal 218 to a low potential. The second capacitor 258 absorbs charge from the output terminal 218.

With the transition of the data signal INB to a high voltage, the boost signal INA transitions to a low voltage to switch off the first N-channel transistor 206 and switch on the first P-channel transistor 204. The first N-channel transistor 206 that is switched off substantially prevents charge transfer from the second summing node 260 to VSS. Following the transition of the boost signal INA to a low voltage, the first P-channel transistor 204 is switched on such that charge from VDD is coupled through the first P-channel transistor 204 to the first summing node 240 and the gate of the transistor of the first capacitor 238 to charge it such that it is ready to provide charge to the output terminal 218 at the next transition of the data signal INB.

The reference signal VPREF provides a control voltage that is applied to the gate of first mirror transistor 230 which then generates a low, substantially constant current to the output terminal 218 through the first enable transistor 232 and the second P-channel transistor 214 to maintain a high voltage on the output terminal 218. Similarly, the reference signal VNREF provides a control voltage that is applied to the gate of the second mirror transistor 250 which then generates a small, substantially constant current source to pull charge from the output terminal 218 through the second N-channel transistor 216, the second enable transistor 252, and the second mirror transistor 250 to maintain a low voltage on the output terminal.

The transmitter circuit 200 is structured to generate a voltage swing at the output terminal 218 around VDD/2 according to various embodiments. The voltage swing can be adjusted to set points other than VDD/2, and this will be selected to keep the first mirror transistor 230 and the second mirror transistor 250 operating in a saturation region to maintain adequate output impedance.

The first capacitor 238 in the pull-up network 220 can provide a substantial amount of charge to raise the potential of the output terminal 218, substantially more than the charge available from the first mirror transistor 230. Similarly, the second capacitor 258 in the pull-down network 222 can withdraw a substantial amount of charge from the output terminal 218, substantially more than the charge drawn by the second mirror transistor 250. The capacitors 238 and 258 are coupled at different times to the output terminal 218 through the second P-channel transistor 214 and the second N-channel transistor 216, to provide a boost current to boost the potential of the output terminal 218, respectively. The boost current is provided during transitions of the data signal DQ. Each of the capacitors 238 and 258 are reset to a known state while the opposite capacitor 238 or 258 is providing the boost current to reduce inter-symbol interference at the output terminal 218 that may occur if the capacitors 238 and 258 do not start from a known level of charge. The reset of the capacitors 238 and 258 is timed by using the boost signal INA that is the complement of the data signal INB. This feature reduces the area and power of the transmitter circuit 200 as no edge transition detection circuits are included to generate a boost current control signal.

The transmitter circuit 200 is a center terminated transmitter circuit that has the capability to drive large capacitive loads with low power. The transmitter circuit 200 reduces the effects of supply and ground noise as well as series resistance in a chip-to-chip interconnect at the output terminal 218. Low currents from the first mirror transistor 230 and the second mirror transistor 250 result in smaller induced electromotive force (emf) of switching currents. This allows low decoupling capacitance for a termination power supply at the output terminal 218 that reduces circuit and die area for generating the termination power supply. The programmable current mirror circuits including the first mirror transistor 230 and the second mirror transistor 250 also help to protect the transmitter circuit 200 from noise from a supply rail for VDD. The low currents in the transmitter circuit 200 allow a low offset voltage over a wide range of series resistances at the output terminal 218 that reduces the effect of series resistance in a chip-to-chip interconnect at the output terminal 218. The transmitter circuit 200 may drive short chip-to-chip interconnects and leverage high termination values and low DC currents to generate an output voltage swing at the output terminal 218.

Figure 4:
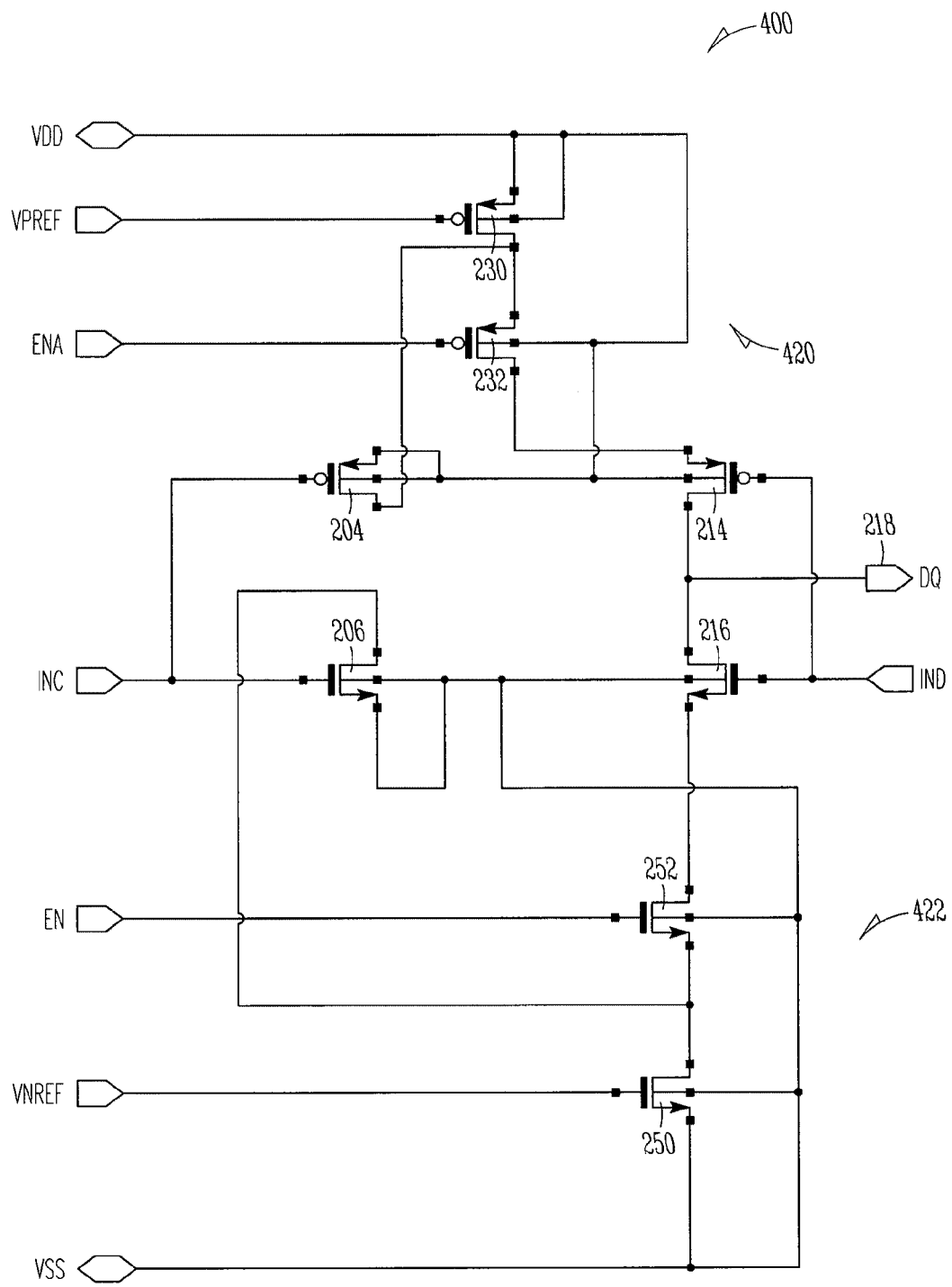
FIG. 4 is an electrical schematic diagram of a transmitter circuit according to various embodiments of the invention.

FIG. 4 is an electrical schematic diagram of a transmitter circuit 400 according to various embodiments of the invention. The transmitter circuit 400 is an example of the transmitter circuit 130 shown in FIG. 1. The transmitter circuit 400 raises a potential of the output terminal 218 with a pull-up network 420 and lowers the potential of the output terminal 218 with a pull-down network 422. Unlike the transmitter circuit 200 shown in FIG. 2, the pull-up network 420 does not include the first capacitor 238 and the pull-down network 422 does not include the second capacitor 258. The transmitter circuit 400 including the pull-up network 420 and the pull-down network 422 includes many elements similar to the transmitter circuit 200 shown in FIG. 2, and similar elements have been given the same reference numerals and will not be described further herein for purposes of brevity.

The gate of the first P-channel transistor 204 and the gate of the first N-channel transistor 206 in the transmitter circuit 400 are coupled to receive a boost signal INC. The gate of the second P-channel transistor 214 and the gate of the second N-channel transistor 216 in the transmitter circuit 400 are coupled to receive a data signal IND. The second P-channel transistor 214 and the second N-channel transistor 216 operate as a buffer circuit, and more particularly an inverter, to generate the data signal DQ from the data signal IND.

Figure 5:
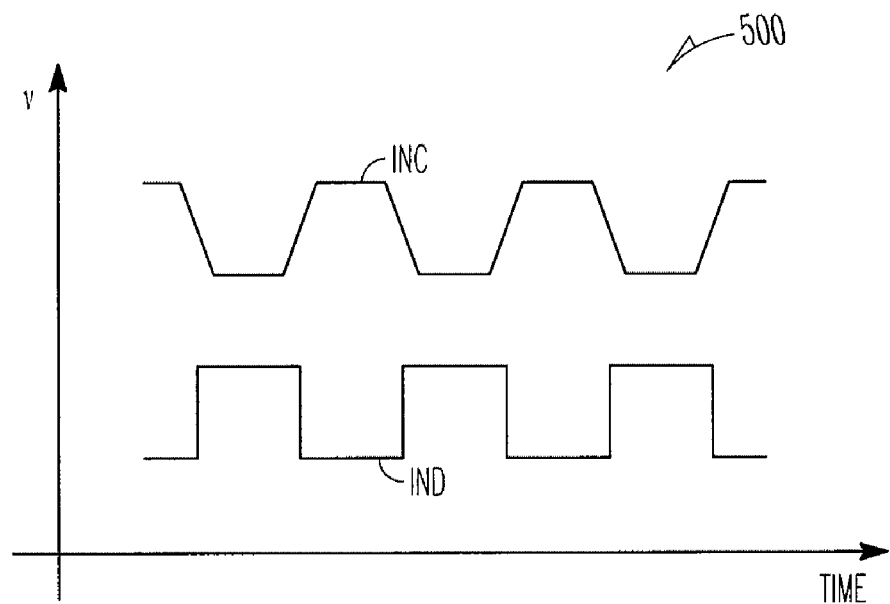
FIG. 5 is a timing chart of a boost signal and a data signal according to various embodiments of the invention.

FIG. 5 is a timing chart 500 of a boost signal INC and a data signal IND according to various embodiments of the invention. The boost signal INC and the data signal IND are first and second parts of an information signal received from a circuit (not shown) other than the transmitter circuit 400. The boost signal INC and the data signal IND are complementary digital signals that transition between a low voltage and a high voltage. The boost signal INC is derived from the data signal IND and has slower edges than the data signal IND. The boost signal INC is rising when the data signal IND is falling, and the boost signal INC is falling when the data signal IND is rising. A slower boost signal INC allows the first P-channel transistor 204 or the first N-channel transistor 206 to pull current longer to provide a boost current. The edge rate of the boost signal INC is programmable according to various embodiments of the invention, and may be changed while a circuit including the transmitter circuit 400 is operating.

The transmitter circuit 400 operates in the following manner with reference to the boost signal INC and the data signal IND shown in FIG. 5. When the output terminal 218 is at a low potential and the data signal IND transitions to a low voltage, the second N-channel transistor 216 switches off and the second P-channel transistor 214 switches on to couple the output terminal 218 to charge from the first mirror transistor 230 through the first enable transistor 232. At approximately the same time that the data signal IND transitions to a low voltage, the boost signal INC transitions to a high voltage to switch off the first P-channel transistor 204 and switch on the first N-channel transistor 206. The slow edge of the boost signal INC results in the first P-channel transistor 204 and the second P-channel transistor 214 being switched on together for a period of time to provide a boost current through the first P-channel transistor 204, the first enable transistor 232, and the second P-channel transistor 214 to raise the potential of the output terminal 218.

The data signal IND then transitions to a high voltage on a subsequent edge that switches off the second P-channel transistor 214 and switches on the second N-channel transistor 216 to couple the output terminal 218 through the second N-channel transistor 216, the second enable transistor 252, and the second mirror transistor 250 to VSS to reduce the potential of the output terminal 218. With the transition of the data signal IND to a high voltage, the boost signal INC transitions to a low voltage to switch off the first N-channel transistor 206 and switch on the first P-channel transistor 204.

The slow edge of the boost signal INC results in the first N-channel transistor 206 and the second N-channel transistor 216 being switched on together for a period of time to draw a boost current from the output terminal 218 through the second N-channel transistor 216, the second enable transistor 252, and the first N-channel transistor 206 to lower the potential of the output terminal 218.

The amount of boost current drawn through the first P-channel transistor 204, or the first N-channel transistor 206, governs the rise and fall time of the data signal DQ on the output terminal 218. The sizes of the transistors 204 and 206 are selected to provide an output current with a fast edge rate at the output terminal 218. To generate more boost current from the transistors 204 and 206, the edge rate of the data signal DQ can be slowed down. This provides more time for the transistors 204 and 206 to be switched off which allows more boost current to flow through the transistors 204 and 206 to or from the output terminal 218.

The transmitter circuit 400 has a reduced circuit area and provides a programmable value of boost current to enable a low power transmitter to drive large capacitive loads at high data rates. The boost current is selected through either device selection or an adjustment of the edge rate of the boost signal INC which allows for control implementations. A self-timed application of the boost current through the use of the boost signal INC that is the complement of the data signal IND may be used to provide the boost current during a transition of the data signal DQ. This use of the complement of the data signal IND reduces the amount of circuitry to drive the output terminal 218 which reduces the area and power required for the transmitter circuit 400.

Figure 6:
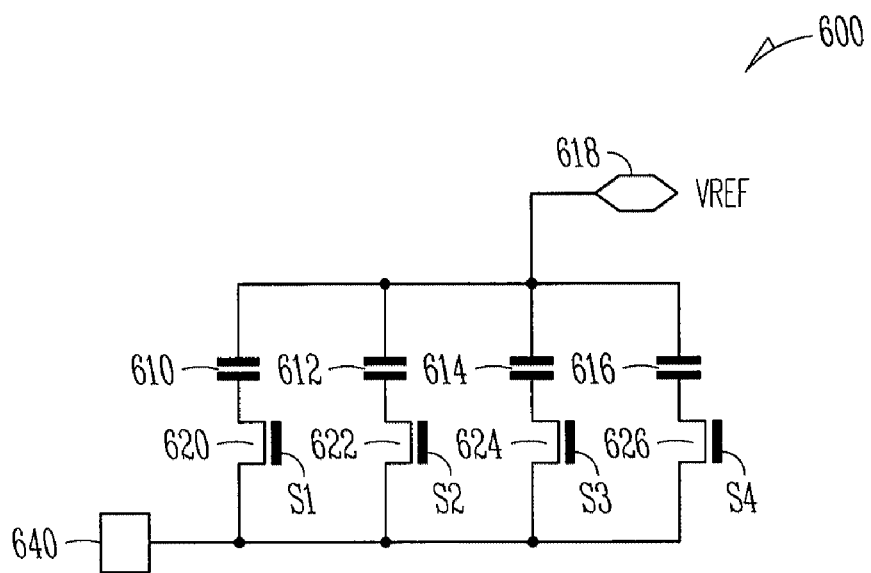
FIG. 6 is an electrical schematic diagram of a programmable capacitor according to various embodiments of the invention.

FIG. 6 is an electrical schematic diagram of a programmable capacitor 600 according to various embodiments of the invention. The programmable capacitor 600 may be substituted for either one or both of the first capacitor 238 and the second capacitor 258 in the transmitter circuit 200 according to various embodiments. The programmable capacitor 600 includes four separate capacitors 610, 612, 614, and 616 coupled in parallel. First plates of the four capacitors 610, 612, 614, and 616 are coupled to a voltage reference VREF at a terminal 618. Second plates of the four capacitors 610, 612, 614, and 616 are coupled, respectively, to separate N-channel transistors. A second plate of the capacitor 610 is coupled to a source of a first N-channel transistor 620. A second plate of the capacitor 612 is coupled to a source of a second N-channel transistor 622. A second plate of the capacitor 614 is coupled to a source of a third N-channel transistor 624, and a second plate of the capacitor 616 is coupled to a source of a fourth N-channel transistor 626. Drains of the N-channel transistors 620, 622, 624, and 626 are coupled to a terminal 640 that is coupled to another circuit (not shown). Gates of the N-channel transistors 620, 622, 624, and 626 are coupled, respectively, to receive separate digital signals S1, S2, S3, and S4. The programmable capacitor 600 provides a programmable capacitance at the terminal 640 based on the number of the digital signals S1, S2, S3, and S4 that are high and the resulting number of the N-channel transistors 620, 622, 624, and 626 that are switched on to couple one or more of the capacitors 610, 612, 614, and 616 to the terminal 640. As each one of the capacitors 610, 612, 614, and 616 is coupled to the terminal 640, the capacitance at the terminal 640 increases relative to the terminal 618. For example, if only the N-channel transistor 620 is switched on by the digital signal S1 and the other N-channel transistors 622, 624, and 626 are switched off, only the capacitor 610 is coupled to the terminal 640. If the first, second, and third N-channel transistors 620, 622, and 624 are switched on by the digital signals S1, S2, and S3, and only the fourth N-channel transistor 626 is switched off, then the first three capacitors 610, 612, and 614 contribute a capacitance to the terminal 640 relative to the terminal 618. The digital signals S1-S4 select between zero and four of the capacitors 610, 612, 614 and 616 to provide a programmable capacitance at the terminal 640. The programmable capacitor 600 may have more or fewer capacitors, and the size of the capacitors may vary, according to various embodiments.

The selection of a capacitance of one or both of the first capacitor 238 and the second capacitor 258 can be used to program different values of boost current for the transmitter circuit 200. This programmable value of the boost current can be used to either drive more capacitance at the output terminal 218 or to reduce power consumed by the transmitter circuit 200 by reducing the boost current which results in slower edge rates at the output terminal 218. The capability to program the amount of boost current is useful to reduce power consumption as well as to allow the transmitter circuit 200 to drive variable amounts of output capacitance.

Figure 7:
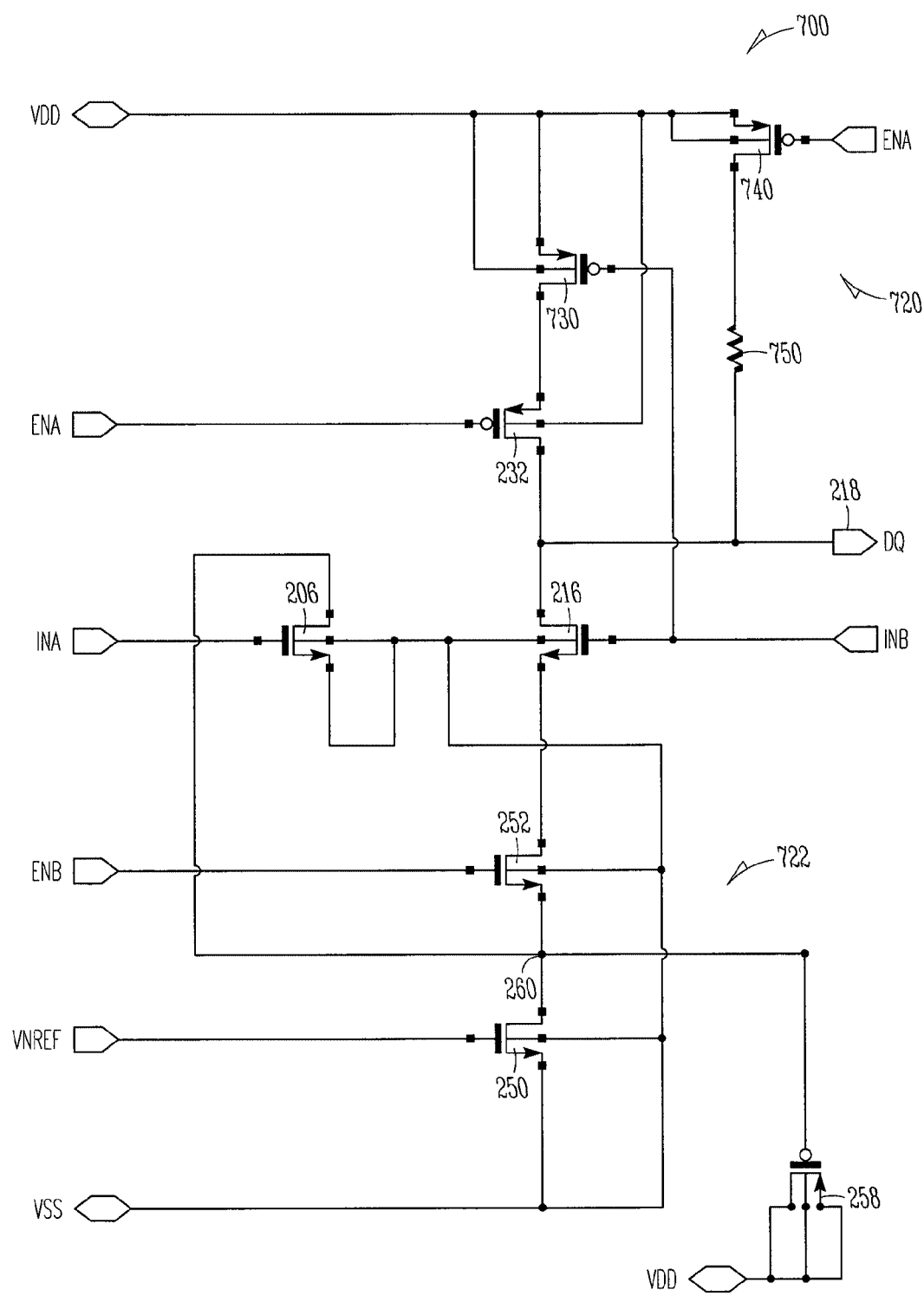
FIG. 7 is an electrical schematic diagram of a transmitter circuit according to various embodiments of the invention.

FIG. 7 is an electrical schematic diagram of a transmitter circuit 700 according to various embodiments of the invention. The transmitter circuit 700 is an example of the transmitter circuit 130 shown in FIG. 1. The transmitter circuit 700 raises a potential of the output terminal 218 with a pull-up network 720 and lowers the potential of the output terminal 218 with a pull-down network 722. The transmitter circuit 700 and the pull-down network 722 include many elements similar to the transmitter circuit 200 and the pull-down network 222 shown in FIG. 2, and similar elements have been given the same reference numerals and will not be described further herein for purposes of brevity. In contrast to the transmitter circuit 200, the transmitter circuit 700 does not include the first P-channel transistor 204 or the second P-channel transistor 214. The pull-up network 720 includes the first enable transistor 232 that is shown and described with reference to the pull-up network 220 shown in FIG. 2. The pull-up network 720 may couple the output terminal 218 directly to VDD as will be described hereinbelow.

The gate of the first N-channel transistor 206 is coupled to receive the boost signal INA, and the gate of the second N-channel transistor 216 is coupled to receive the data signal INB. The boost signal INA and the data signal INB are shown in FIG. 3. The data signal INB is also coupled to a gate of a high P-channel transistor 730 having a source coupled to VDD and a drain coupled to the source of the first enable transistor 232. The drain of the first enable transistor 232 is coupled to the output terminal 218 and the drain of the second N-channel transistor 216. The data signal INB may switch on the high P-channel transistor 730 to couple the output terminal 218 to VDD through the first enable transistor 232 and the high P-channel transistor 730 as will be described hereinbelow.

The pull-up network 720 includes a third enable transistor 740 and a termination resistor 750. The third enable transistor 740 is a P-channel transistor including a source coupled to VDD and a drain coupled to a first end of the termination resistor 750. A second end of the termination resistor 750 is coupled to the output terminal 218. A gate of the third enable transistor 740 is coupled to receive the first enable signal ENA along with the first enable transistor 232 and both enable transistors 232 and 740 are switched on by the first enable signal ENA unless the transmitter circuit 200 is to be tri-stated. The output terminal 218 is coupled to VDD through the third enable transistor 740 and a termination resistor 750 that set the voltage swing on the output terminal 218. The first, second, and third enable transistors 232, 252, and 740 may be switched off by the first and second enable signals ENA and ENB to tri-state the transmitter circuit 700 if necessary.

The transmitter circuit 700 operates in the following manner. When the output terminal 218 is at a low potential and the data signal INB transitions to a low voltage, the high P-channel transistor 730 switches on to couple the output terminal 218 to VDD through the first enable transistor 232 and the high P-channel transistor 730 to raise the potential of the output terminal 218. VDD may originate from a supply rail, and the transmitter circuit 700 raises the potential of the output terminal 218 directly from the supply rail at VDD through the pull-up network 720. The pull-down network 722 operates to lower the potential of the output terminal 218 in the same manner as the pull-down network 222 shown in FIG. 2, and will not be described further herein for purposes of brevity. The transmitter circuit 700 thereby generates the data signal DQ on the output terminal 218 from the data signal INB.

According to various embodiments, the pull-down network 722 does not include the second capacitor 258. The gate of the first N-channel transistor 206 is coupled to receive the boost signal INC and the gate of the second N-channel transistor 216 is coupled to receive the data signal IND where the boost signal INC and the data signal IND are shown in FIG. 5. The pull-up network 720 operates to raise the potential of the output terminal 218 through the first enable transistor 232 and the high P-channel transistor 730 as described above. The pull-down network 722 operates to lower the potential of the output terminal 218 in the same manner as the pull-down network 422 shown in FIG. 4, and will not be described further herein for purposes of brevity. The transmitter circuit 700 thereby generates the data signal DQ on the output terminal 218 from the data signal IND.

Figure 8:
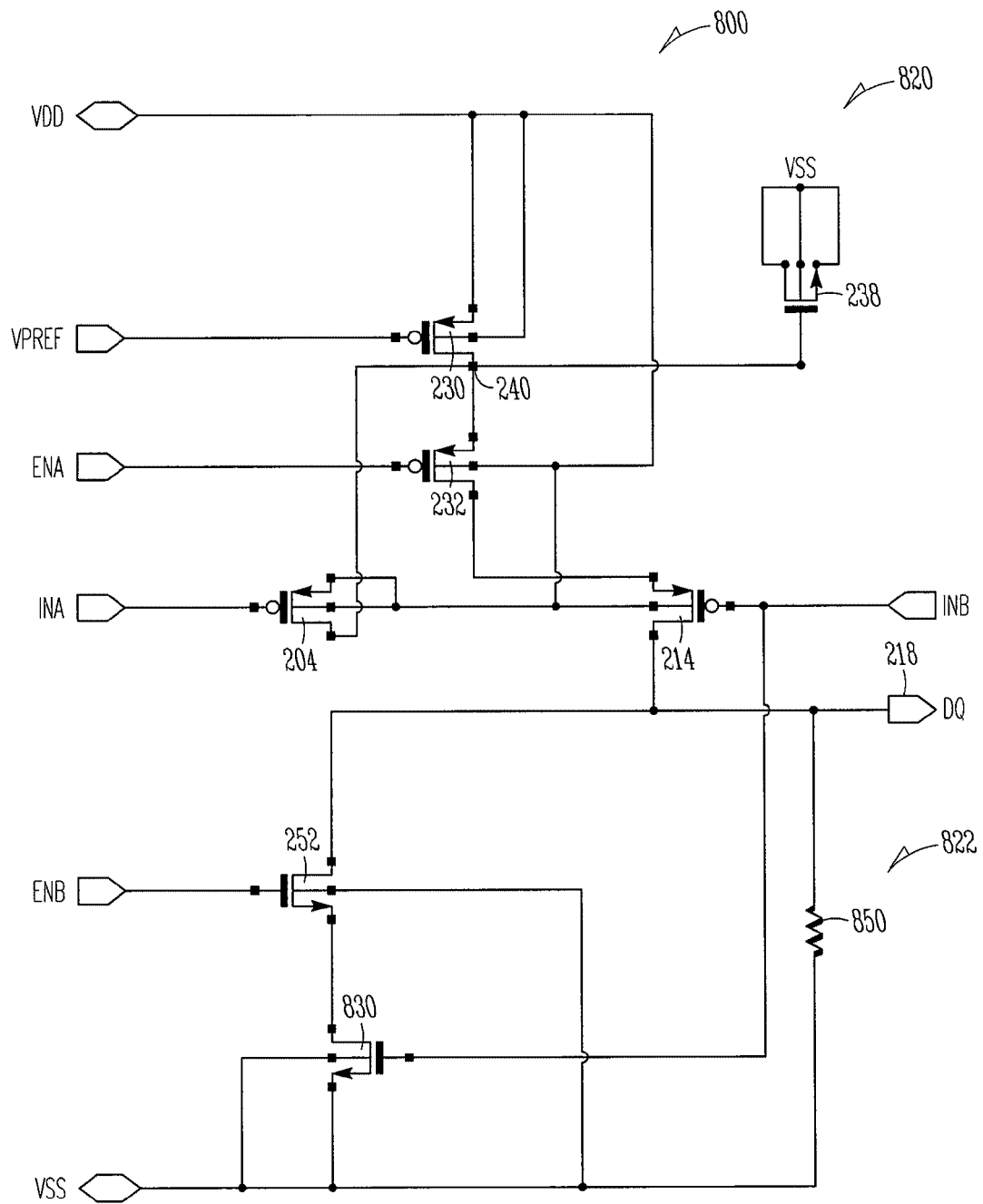
FIG. 8 is an electrical schematic diagram of a transmitter circuit according to various embodiments of the invention.

FIG. 8 is an electrical schematic diagram of a transmitter circuit 800 according to various embodiments of the invention. The transmitter circuit 800 is an example of the transmitter circuit 130 shown in FIG. 1. The transmitter circuit 800 raises a potential of the output terminal 218 with a pull-up network 820 and lowers the potential of the output terminal 218 with a pull-down network 822. The transmitter circuit 800 and the pull-up network 820 include many elements similar to the transmitter circuit 200 and the pull-up network 220 shown in FIG. 2, and similar elements have been given the same reference numerals and will not be described further herein for purposes of brevity. In contrast to the transmitter circuit 200, the transmitter circuit 800 does not include the first N-channel transistor 206 or the second N-channel transistor 216. The pull-down network 822 includes the second enable transistor 252 that is shown and described with reference to the pull-down network 222 shown in FIG. 2. The pull-down network 822 may couple the output terminal 218 directly to VSS as will be described hereinbelow.

The gate of the first P-channel transistor 204 is coupled to receive the boost signal INA, and the gate of the second P-channel transistor 214 is coupled to receive the data signal INB. The boost signal INA and the data signal INB are shown in FIG. 3. The data signal INB is also coupled to a gate of a low N-channel transistor 830 having a source and a body terminal coupled to VSS and a drain coupled to the source of the second enable transistor 252. The drain of the second enable transistor 252 is coupled to the output terminal 218 and the source of the second P-channel transistor 214. The data signal INB may switch on the low N-channel transistor 830 to couple the output terminal 218 to VSS through the second enable transistor 252 and the low N-channel transistor 830 as will be described hereinbelow.

The pull-down network 822 includes a termination resistor 850 coupled between the output terminal 218 and VSS such that the termination resistor 850 sets the voltage swing on the output terminal 218. The first and second enable transistors 232 and 252 may be switched off by the first and second enable signals ENA and ENB to tri-state the transmitter circuit 800 if necessary.

The transmitter circuit 800 operates in the following manner. When the output terminal 218 is at a high potential and the data signal INB transitions to a high voltage, the low N-channel transistor 830 switches on to couple the output terminal 218 to VSS through the second enable transistor 252 and the low N-channel transistor 830 to lower the potential of the output terminal 218. VSS may originate from a supply rail, and the transmitter circuit 800 lowers the potential of the output terminal 218 directly from the supply rail at VSS through the pull-down network 822. The pull-up network 820 operates to raise the potential of the output terminal 218 in the same manner as the pull-up network 220 shown in FIG. 2, and will not be described further herein for purposes of brevity. The transmitter circuit 800 thereby generates the data signal DQ on the output terminal 218 from the data signal INB.

According to various embodiments, the pull-up network 820 does not include the first capacitor 238. The gate of the first P-channel transistor 204 is coupled to receive the boost signal INC and the gate of the second P-channel transistor 214 is coupled to receive the data signal IND where the boost signal INC and the data signal IND are shown in FIG. 5. The pull-down network 822 operates to lower the potential of the output terminal 218 through the second enable transistor 252 and the low N-channel transistor 830 as described above. The pull-up network 820 operates to raise the potential of the output terminal 218 in the same manner as the pull-up network 420 shown in FIG. 4, and will not be described further herein for purposes of brevity. The transmitter circuit 800 thereby generates the data signal DQ on the output terminal 218 from the data signal IND.

The transmitter circuits 700 and 800 shown in FIGS. 7 and 8 are supply rail terminated transmitter circuits that have the capability to drive large capacitive loads with low power. The transmitter circuits 700 and 800 may drive short chip-to-chip interconnects and leverage high termination values and low DC currents to generate an output voltage swing at the output terminal 218 and reduce power consumption. The size of the output voltage swing can be varied by changing either the termination resistor 750 or 850 or the amount of current provided from the first mirror transistor 230 or the second mirror transistor 250.

The transmitter circuits 700 and 800 reduce the effect of ground noise with a low voltage swing at the output terminal 218 and the programmable current mirror circuits to provide insulation from a ground rail at VSS. The low voltage swing results in a low current swing that keeps an induced emf at the output terminal 218 low. This feature may reduce a supply decoupling capacitance and the circuit or die area of the transmitter circuits 700 and 800. The low current swing may reduce the effect of series resistance in a chip-to-chip interconnect at the output terminal 218. The low current requirements result in a low offset voltage over a range of series channel resistances at the output terminal 218.

Figure 9:
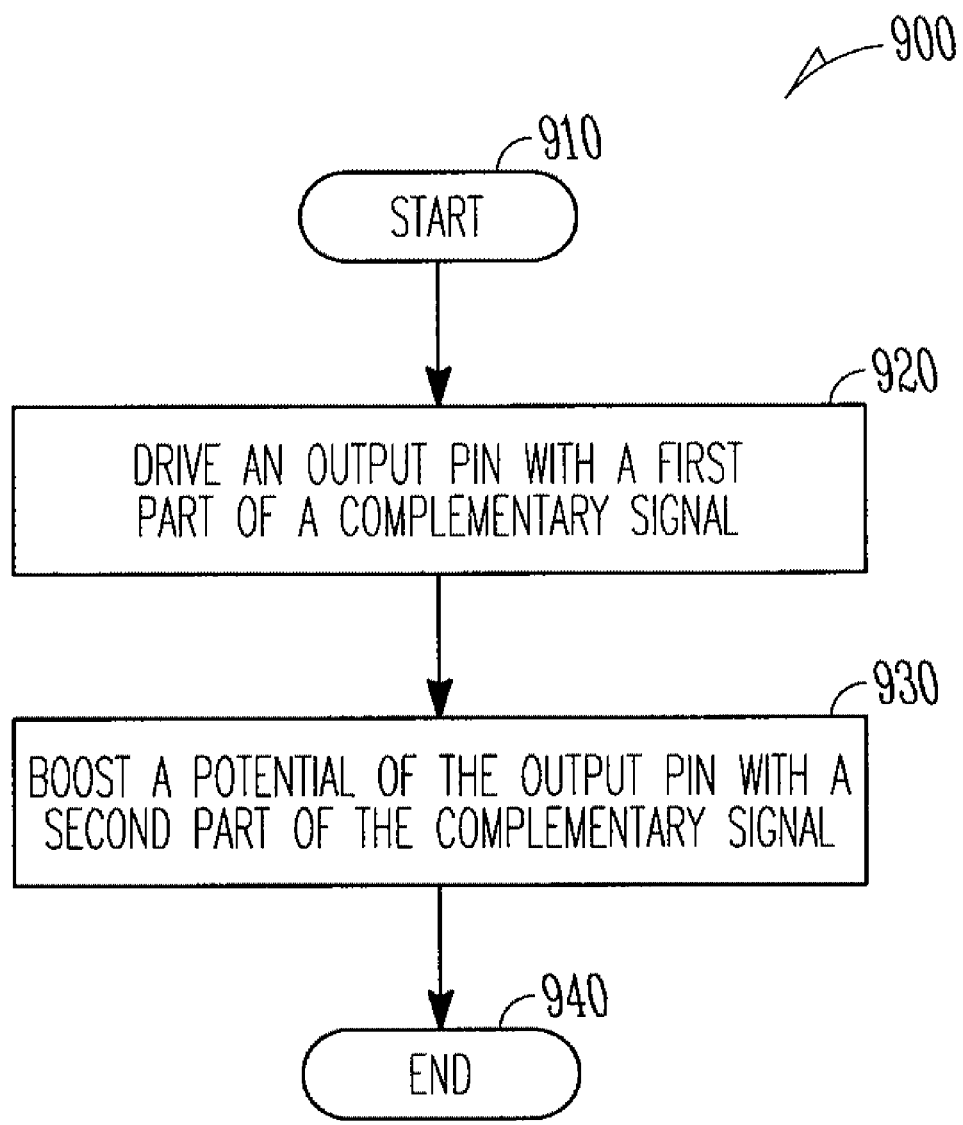
FIG. 9 is a flow diagram of operations or methods according to various embodiments of the invention.

FIG. 9 is a flow diagram of operations or methods 900 according to various embodiments of the invention. In block 910, the methods 900 start. In block 920, an output pin is driven with a first part of a complementary signal. In block 930, a potential of the output pin is boosted with a second part of the complementary signal. In block 940, the methods 900 end.

The individual activities of methods 900 do not have to be performed in the order shown or in any particular order. Some activities may be repeated, and others may occur only once. Embodiments of the invention may have more or fewer activities than those shown in FIG. 9.

Figure 10:
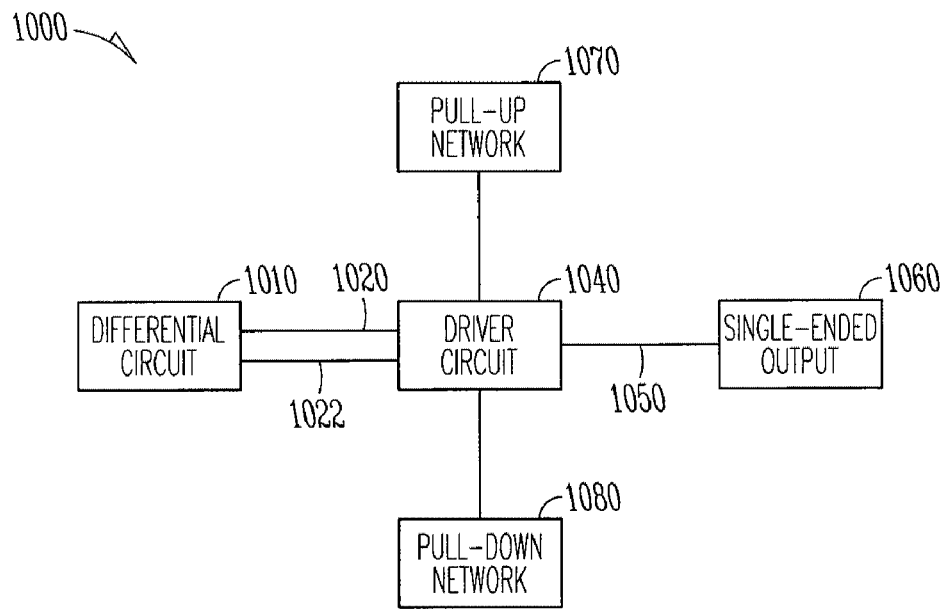
FIG. 10 is a block diagram of a transmitter system according to various embodiments of the invention.

FIG. 10 is a block diagram of a transmitter system 1000 according to various embodiments of the invention. A differential circuit 1010 generates a differential signal on a pair of lines 1020 and 1022 that are coupled to a driver circuit 1040. The driver circuit 1040 generates a single-ended output signal on a line 1050 from the differential signal on the lines 1020 and 1022. The line 1050 couples the single-ended output signal to a single-ended output 1060. A pull-up network 1070 is coupled between a voltage supply and the driver circuit 1040 to raise a potential of the line 1050 and the single-ended output 1060. A pull-down network 1080 is coupled between a low voltage reference such as a ground voltage and the driver circuit 1040 to lower the potential of the line 1050 and the single-ended output 1060. The pull-up network 1070, the driver circuit 1040, and the pull-down network 1080 are components or modules of a transmitter circuit according to embodiments of the invention.

Figure 11:
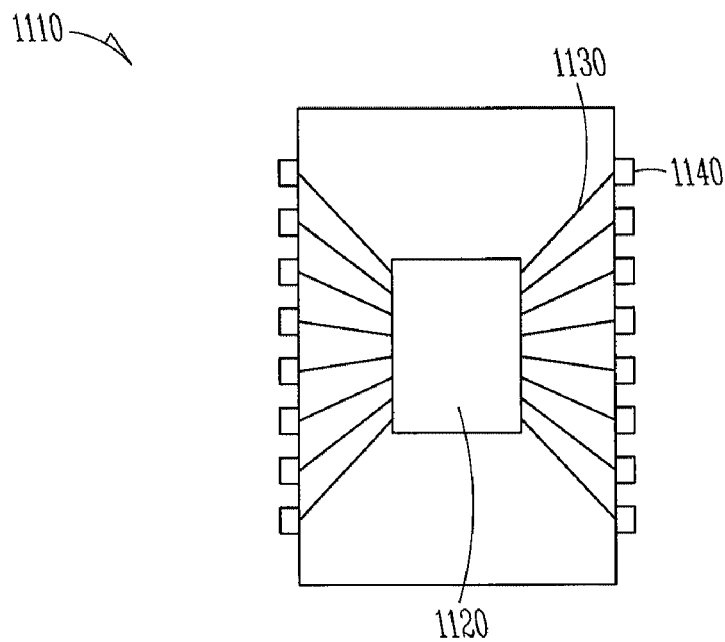
FIG. 11 is a block diagram of an integrated circuit package according to various embodiments of the invention.

FIG. 11 is a block diagram of an integrated circuit package 1110 according to various embodiments of the invention. The integrated circuit package 1110 includes an integrated circuit die 1120 that contains various circuit components such as transistors and resistors. The integrated circuit die 1120 includes a transmitter circuit according to embodiments of the invention described herein. The transmitter circuit in the integrated circuit die 1120 is coupled via a bond wire 1130 to an external pin 1140 of the integrated circuit package 1110. A signal may be transmitted by the transmitter circuit via the bond wire 1130 and the external pin 1140 to other integrated circuit packages. The integrated circuit package 1110 includes other bond wires and external pins to transmit other signals from multiple transmitter circuits in the integrated circuit die 1120 according to various embodiments. The integrated circuit die 1120 may include one or more of an amplifier, a processor, a memory device such as a dynamic random access memory (DRAM), a synchronous DRAM (SDRAM), or a Flash memory device, or a computer chipset such as a memory controller.

Figure 12:
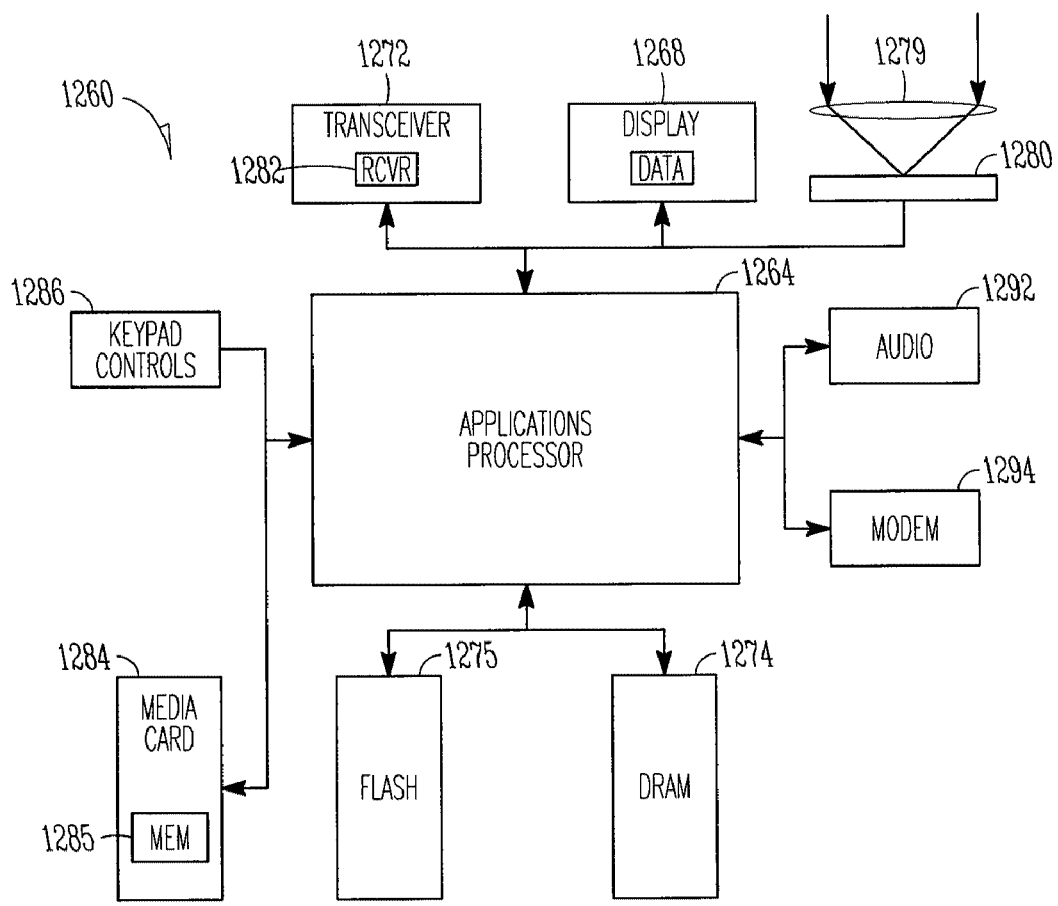
FIG. 12 is a block diagram of a system according to various embodiments of the invention.

FIG. 12 is a block diagram of a system 1260 according to various embodiments of the invention. The system 1260, in various embodiments, may include a processor 1264 coupled to a display 1268 and/or a wireless transceiver 1272. The display 1268 may be used to display data, perhaps received by the wireless transceiver 1272. The system 1260, in various embodiments, may include a memory device such as a DRAM 1274 and/or a Flash memory 1275. The processor 1264 is coupled to exchange data with the DRAM 1274 and the Flash memory 1275. The DRAM 1274 may be a SDRAM.

In various embodiments, the system 1260 may include a camera including a lens 1279 and an imaging plane 1280 to couple to the processor 1264. The imaging plane 1280 may be used to receive light captured by the lens 1279.

Many variations are possible. For example, in various embodiments, the system 1260 may include a cellular telephone receiver 1282 forming a portion of the wireless transceiver 1272. The cellular telephone receiver 1282 may also receive data to be processed by the processor 1264, and displayed on the display 1268. In various embodiments, the system 1260 may include an audio, video, or multi-media player 1284, including a memory device 1285 and a set of media playback controls 1286 to couple to the processor 1264. The processor 1264 may also be coupled to exchange data with an audio device 1292 and/or a modem 1294.

Any of the electronic components of the system 1260 may include a transmitter circuit according to various embodiments. For example, one or more of the processor 1264, the DRAM 1274, and the Flash memory 1275 may include a transmitter circuit to transmit a single-ended signal generated from a complementary signal according to various embodiments of the invention.

Any of the circuits or systems described herein may be referred to as a module. A module may comprise a circuit and/or firmware according to embodiments of the invention.

Transmitter circuit mechanisms presented herein may drive large capacitive loads with low power and reduce the effects of supply and ground noise as well as series resistance in a chip-to-chip interconnect. An output pin of a transmitter circuit is driven with a data signal and a potential of the output pin is boosted with a complementary signal. The output pin may be boosted during each transition of the data signal. This can lead to a significant performance improvement.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the claims. In addition, in the foregoing Detailed Description, it can be seen that various features are arranged together for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of one or more of the disclosed embodiments. Thus, the following claims are hereby incorporated into the Detailed Description, with each claim standing on its own as a separate embodiment.

What is claimed is:

1. An apparatus comprising:
a first device to drive an information signal on to an output; and
a capacitor to boost a voltage of the output in response to a complementary signal, the complementary signal being derived from the information signal.

2. The apparatus of claim 1, wherein:
the first device includes a drive transistor having a gate coupled to receive the information signal and terminals coupled between a source and the output; and
the capacitor is to be coupled to the output during a period of time to boost the voltage of the output.

3. The apparatus of claim 1, wherein the capacitor includes:
a first capacitor to be coupled to the output; and
a second capacitor to be coupled to the output.

4. The apparatus of claim 1, further comprising a current mirror circuit coupled to the first device to couple a substantially constant current to the output through the first device to maintain a potential of the output.

5. An apparatus comprising:
a first device to drive an information signal on to an output;
a second device to boost a voltage of the output in response to a complementary signal, the complementary signal being derived from the information signal;
a current mirror circuit coupled to the first device to couple a substantially constant current to the output through the first device to maintain a potential of the output; and
wherein the second device is coupled to the first device at a summing node to add a second current to the substantially constant current that is coupled to the output through the first device during a period of time to change the potential of the output.

6. The apparatus of claim 1, further comprising a second device to couple the output to a voltage rail to drive the information signal on to the output.

7. A method comprising:
driving an output pin with a data signal; and
boosting a potential of the output pin with a capacitor in response to a boost signal during each transition of the data signal, the boost signal being derived from the data signal and complementary to the data signal.

8. The method of claim 7, wherein boosting a potential of the output pin includes coupling the capacitor to the output pin in response to the boost signal.

9. A method comprising:
driving an output pin with a data signal;
boosting a potential of the output pin in response to a boost signal during each transition of the data signal, the boost signal being derived from the data signal and complementary to the data signal; and
wherein boosting a potential of the output pin includes:
coupling a first capacitor to the output pin and discharging a second capacitor during each positive transition of the data signal in response to the boost signal; and
coupling the second capacitor to the output pin and charging the first capacitor during each negative transition of the data signal in response to the boost signal.

10. A method comprising:
driving an output pin with a data signal; and
boosting a potential of the output pin in response to a boost signal during each transition of the data signal including coupling a capacitor to the output pin in response to the boost signal, the boost signal being derived from the data signal and complementary to the data signal; and
changing a capacitance of the capacitor.

11. A method comprising:
driving an output pin with a data signal;
boosting a potential of the output pin in response to a boost signal during each transition of the data signal, the boost signal derived from the data signal and complementary to the data signal;
slowing edge rates of the boost signal with respect to edge rates of the data signal; and
wherein:
driving an output pin with a data signal includes driving the output pin with a transistor coupled between a source and the output pin in response to the data signal; and
boosting the potential of the output pin includes coupling the source to the output pin through a second transistor in response to the boost signal such that the first transistor and the second transistor are both switched on during a period of time.

12. The method of claim 7 wherein boosting the potential of the output pin includes:
coupling a first capacitor to the output pin and discharging a second capacitor during each positive transition of the data signal in response to the boost signal; and
coupling the second capacitor to the output pin and charging the first capacitor during each negative transition of the data signal in response to the boost signal.

13. The method of claim 7, further comprising coupling a substantially constant current from a current source to the output pin to maintain a potential of the output pin.

14. A method comprising:
driving an output pin with a data signal;
boosting a potential of the output pin in response to a boost signal during each transition of the data signal, the boost signal being derived from the data signal and complementary to the data signal;
coupling a substantially constant current from a current source to the output pin to maintain a potential of the output pin; and
adding a second current to the substantially constant current at a summing node that is coupled to the output pin during a period of time to change the potential of the output pin.

15. The method of claim 14, wherein adding a second current to the substantially constant current at a summing node includes adding the second current that is greater than the substantially constant current.

16. The method of claim 7, wherein:
driving an output pin with a data signal includes coupling a substantially constant current from a first transistor to the output pin through a drive transistor in response to the data signal to maintain a potential of the output pin.

17. The method of claim 7, wherein:
driving an output pin with a data signal includes driving the output pin with the data signal that is a digital signal that transitions between a low voltage and a high voltage; and
boosting a potential of the output pin includes boosting the potential of the output pin in response to the boost signal that is a digital signal that transitions between a low voltage and a high voltage.

18. An apparatus comprising:
a buffer circuit coupled to an output to drive a data signal on to the output; and
a boost circuit including a capacitor coupled to the output to boost a voltage of the output in response to a boost signal, the boost signal being derived from the data signal and complementary to the data signal.

19. The apparatus of claim 18, wherein the buffer circuit and the boost circuit are coupled to a summing node, charge being coupled from the boost circuit to the buffer circuit during a period of time at the summing node.

20. The apparatus of claim 18, wherein the buffer circuit includes:
a P-channel metal oxide semiconductor (MOS) transistor having a source coupled to a voltage supply, a drain coupled to the output, and a gate coupled to receive the data signal; and
an N-channel MOS transistor having a source coupled to a voltage reference, a drain coupled to the output, and a gate coupled to receive the data signal.

21. The apparatus of claim 18, wherein the capacitor is to be coupled through the buffer circuit to the output during a first transition of the data signal and is to be coupled to a voltage source or a voltage reference during a second transition of the data signal.

22. An apparatus comprising:
a buffer circuit coupled to an output to drive a data signal on to the output;
a boost circuit coupled to the output to boost a voltage of the output in response to a boost signal, the boost signal being derived from the data signal and complementary to the data signal; and
wherein
the boost circuit includes a capacitor that is coupled through the buffer circuit to the output during a first transition of the data signal and is coupled to a voltage source or a voltage reference during a second transition of the data signal; and the capacitor is a programmable capacitor having a capacitance that may be changed by one or more control signals.

23. The apparatus of claim 18, wherein the capacitor includes: a first capacitor to be coupled to the output; and a second capacitor to be coupled to the output.

24. An apparatus comprising:

a buffer circuit coupled to an output to drive a data signal on to the output;

a boost circuit coupled to the output to boost a voltage of the output in response to a boost signal, the boost signal being derived from the data signal and complementary to the data signal; and a programmable current mirror circuit coupled to the buffer circuit to couple a substantially constant current to the output through the buffer circuit to maintain a potential of the output.

25. The apparatus of claim 18, wherein the buffer circuit includes a device to couple the output to a voltage rail to drive the data signal on to the output.

* * * * *